United States Patent
Tan et al.

(10) Patent No.: US 8,219,892 B2
(45) Date of Patent: Jul. 10, 2012

(54) SYSTEMS AND METHODS FOR ENHANCED MEDIA DEFECT DETECTION

(75) Inventors: Weijun Tan, Longmont, CO (US);
Hongwei Song, Longmont, CO (US);
Shaohua Yang, Santa Clara, CA (US)

(73) Assignee: Agere Systems Inc., Allentown, PA (US)

( * ) Notice: Subject to any disclaimer, the term of this patent is extended or adjusted under 35 U.S.C. 154(b) by 796 days.

(21) Appl. No.: 12/399,713

(22) Filed: Mar. 6, 2009

(65) Prior Publication Data
US 2010/0226033 A1    Sep. 9, 2010

(51) Int. Cl.
*G06F 11/00* (2006.01)
(52) U.S. Cl. .................... 714/780; 714/769
(58) Field of Classification Search .......... 714/769, 714/780; 375/340–343
See application file for complete search history.

(56) References Cited

U.S. PATENT DOCUMENTS

| | | | |
|---|---|---|---|
| 6,065,149 A | 5/2000 | Yamanaka | |
| 6,456,646 B1 * | 9/2002 | Asokan et al. | 375/142 |
| 6,691,263 B2 | 2/2004 | Vasic et al. | |
| 6,738,948 B2 * | 5/2004 | Dinc et al. | 714/794 |
| 6,980,382 B2 | 12/2005 | Hirano et al. | |
| 7,154,936 B2 | 12/2006 | Bjerke et al. | |
| 7,168,030 B2 * | 1/2007 | Ariyoshi | 714/786 |
| 7,203,015 B2 | 4/2007 | Sakai et al. | |
| 7,237,173 B2 * | 6/2007 | Morita et al. | 714/755 |
| 7,254,192 B2 * | 8/2007 | Onggosanusi et al. | 375/340 |
| 7,257,172 B2 * | 8/2007 | Okamoto et al. | 375/341 |
| 7,359,313 B2 | 4/2008 | Chan et al. | |
| 7,441,174 B2 | 10/2008 | Li et al. | |
| 7,688,915 B2 * | 3/2010 | Tanrikulu et al. | 375/316 |
| 2003/0063405 A1 | 4/2003 | Jin et al. | |
| 2007/0061687 A1 | 3/2007 | Hwang | |
| 2009/0235116 A1 | 9/2009 | Tan et al. | |
| 2009/0235146 A1 | 9/2009 | Tan et al. | |
| 2009/0268575 A1 | 10/2009 | Tan et al. | |
| 2009/0268848 A1 | 10/2009 | Tan et al. | |
| 2009/0269081 A1 * | 10/2009 | Cai et al. | 398/202 |
| 2009/0271670 A1 * | 10/2009 | Tan et al. | 714/719 |
| 2010/0042877 A1 | 2/2010 | Tan | |
| 2010/0074078 A1 | 3/2010 | Cao | |

FOREIGN PATENT DOCUMENTS

| | | |
|---|---|---|
| JP | 10-145243 | 5/1998 |
| JP | 2007-087529 | 4/2007 |

OTHER PUBLICATIONS

U.S. Appl. No. 12/399,679, filed Mar. 6, 2009, Dziak, Scott.
U.S. Appl. No. 12/399,750, filed Mar. 6, 2009, Weijun Tan.
Kavcic et al., "A Signal-Dependent Autoregressive Channel Model", IEEE Transactions on Magnetics, vol. 35, No. 5, Sep. 1999 pp. 2316-2318.

\* cited by examiner

*Primary Examiner* — Joshua Lohn
(74) *Attorney, Agent, or Firm* — Hamilton, DeSanctis & Cha

(57) ABSTRACT

Various embodiments of the present invention provide systems and methods for detecting storage medium defects. As one example, a media defect detection system is disclosed that includes a data detector circuit that applies a detection algorithm to the data input and provides a hard output and a soft output. A first circuit combines a first derivative of the hard output with a derivative of the data input to yield a first combined signal. A second circuit combines a second derivative of the hard output with a derivative of the first combined signal to yield a second combined signal. A third circuit combines a derivative of the soft output with the second combined signal and a threshold value to yield a defect signal.

20 Claims, 7 Drawing Sheets

SYSTEMS AND METHODS FOR ENHANCED MEDIA DEFECT DETECTION

BACKGROUND OF THE INVENTION

The present invention is related to storage media. More particularly, the present invention is related to systems and methods for identifying defective regions on a storage medium.

A typical storage medium includes a number of storage locations where data may be stored. Data is written to the medium within areas designated for user data by positioning a read/write head assembly over the medium at a particular location, and subsequently passing a modulated electric current through the head assembly such that a corresponding magnetic flux pattern is induced in the storage medium. To retrieve the stored data, the head assembly is positioned over a track containing the desired information and advanced until it is over the desired data. In this position, the previously stored magnetic flux pattern operates to induce a current in the head assembly. This induced current may then be converted to represent the originally recorded data.

The storage locations on the storage medium are typically arranged as a serial pattern along concentric circles known as tracks. FIG. 1 shows a storage medium 100 with two exemplary tracks 150,155 indicated as dashed lines and written respective distances from an outer perimeter 140. The tracks are segregated by servo data written within wedges 160, 165. Wedges 160, 165 include data and supporting bit patterns that are used for control and synchronization of the head assembly over a desired storage location on storage medium 100. In particular, such wedges traditionally include a preamble pattern 152 followed by a single sector address mark (SAM) 154 as shown by element 110. SAM 154 is followed by a Gray code 156, and Gray code 156 is followed by burst information 158. It should be noted that while two tracks and two wedges are shown, hundreds of each would typically be included on a given storage medium. Further, it should be noted that a sector may have two or more bursts.

Manufacturing the storage medium includes performing a variety of steps any of which can result in a defective region on the storage medium. Further, defective regions may develop over the time that the storage medium is used. Writing data to a defective region can result in the loss of such data. To avoid this, some approaches have been developed to identify defective regions as unusable. This works reasonably well, but does not identify regions that become defective over time and does not always identify all defective regions. In such cases, such an approach is not effective.

Hence, for at least the aforementioned reasons, there exists a need in the art for advanced systems and methods for identifying defective regions on a storage medium.

BRIEF SUMMARY OF THE INVENTION

The present invention is related to storage media. More particularly, the present invention is related to systems and methods for identifying defective regions on a storage medium.

Various embodiments of the present invention provide a media defect detection systems. Such media defect detection systems include a data detector circuit that applies a detection algorithm to the data input and provides a hard output and a soft output. A first circuit combines a first derivative of the hard output with a derivative of the data input to yield a first combined signal. A second circuit combines a second derivative of the hard output with a derivative of the first combined signal to yield a second combined signal. A third circuit combines a derivative of the soft output with the second combined signal and a threshold value to yield a defect signal. In some instances of the aforementioned embodiments, the detection algorithm is a maximum a posteriori algorithm. In one or more cases of the aforementioned embodiments, the threshold value is programmable.

In one or more instances of the aforementioned embodiments, the first circuit includes a multiplier circuit. In such cases, the first combined output is the first derivative of the hard output multiplied by the derivative of the data input. In some cases, the systems further include a partial response target filter circuit and a squaring circuit. In such cases, the first derivative of the hard output is the hard output after processing by the partial response target filter circuit and the squaring circuit. In other instances of the aforementioned embodiments, the system further includes a partial response target filter circuit receiving the hard output and providing the first derivative of the hard output.

In various instances of the aforementioned embodiments, the second circuit includes a division circuit. In such instances, the second combined output is a ratio of the second derivative of the hard output and the derivative of the first combined signal. In some such instances, the system further includes a partial response target filter circuit, a squaring circuit, and a low pass filter. The second derivative of the hard output is the hard output after processing by the partial response target filter circuit, the squaring circuit and the low pass filter.

In one or more embodiments of the present invention, the system further includes partial response target filter circuit receiving the soft output, and a polarity adjustment circuit that receives an output from the partial response target filter circuit and eliminates negative polarity signals to yield a polarity output. An envelope detector performs a filtering of the polarity output to yield an envelope output, a normalizing circuit normalizes the envelope output to one to yield a normalized output, and a low pass filter that low pass filters the normalized output to yield the derivative of the soft output. The polarity adjustment circuit may be, for example, a magnitude circuit providing an absolute value of an input or a positive hold circuit that effectively ignores negative inputs.

Other embodiments of the present invention provide media defect detection circuits that include a data detector circuit that applies a detection algorithm to the data input and provides a hard output and a soft output. A first circuit combines a first derivative of the hard output with a derivative of the data input to yield a first combined signal. A second circuit combines a second derivative of the hard output with a first derivative of the soft output to yield a second combined signal. A third combines a second derivative of the soft output with a derivative of the first combined signal and a threshold value to yield a third combined signal. A comparator compares the third combined signal with the second combined signal to yield a defect signal. In one or more cases, the detection algorithm is a maximum a posteriori algorithm, and the threshold value is programmable.

In some instances of the aforementioned embodiments, the circuit further includes a partial response target filter receiving the hard output and providing the first derivative of the hard output, wherein the first circuit includes a multiplier circuit, wherein the first combined output is the first derivative of the hard output multiplied by the derivative of the data input. In some cases, the circuit further includes a normalizing circuit that receives the soft output and provides the first derivative of the soft output. In such cases, the second circuit includes a multiplier circuit, and the second combined output is the first derivative of the soft output multiplied by the second derivative of the hard output. In one or more cases, the third circuit includes a multiplier, and the third combined signal is the product of multiplying the first combined signal, the threshold value, and the second derivative of the soft output.

In various instances of the aforementioned embodiments, the partial response filter is a first partial response filter. In such instances, the circuits may further include a second partial response target filter receiving the soft output and providing a partial response output, a polarity adjustment circuit, an envelope detector circuit, and a low pass filter. The polarity adjustment circuit receives the partial response output and eliminates negative polarity signals to yield a polarity output. The envelope detector circuit yields an envelope filtered output, and the low pass filter receives the envelope filtered output and provides the second derivative of the soft output.

Yet other embodiments of the present invention provide methods for media defect detection that include: receiving a data input; performing a data detection on the data input, wherein the data detection yields a hard output and a soft output; multiplying a first derivative of the hard output by a derivative of the data input to yield a first combined signal; multiplying a second derivative of the hard output by a first derivative of the soft output to yield a second combined signal; multiplying a second derivative of the soft output by a derivative of the first combined signal and a threshold value to yield a third combined signal; and comparing the third combined signal with the second combined signal to yield a defect flag.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to storage media. More particularly, the present invention is related to systems and methods for identifying defective regions on a storage medium.

Various embodiments of the present invention provide media defect detection systems, circuits and methods that utilize a ratio of pre-detected data samples and post detected data samples in combination with soft decision information. Among many advantages over other media defect approaches, such an approach provides an ability to detect defective regions exhibiting greater signal amplitude.

Figure 1:
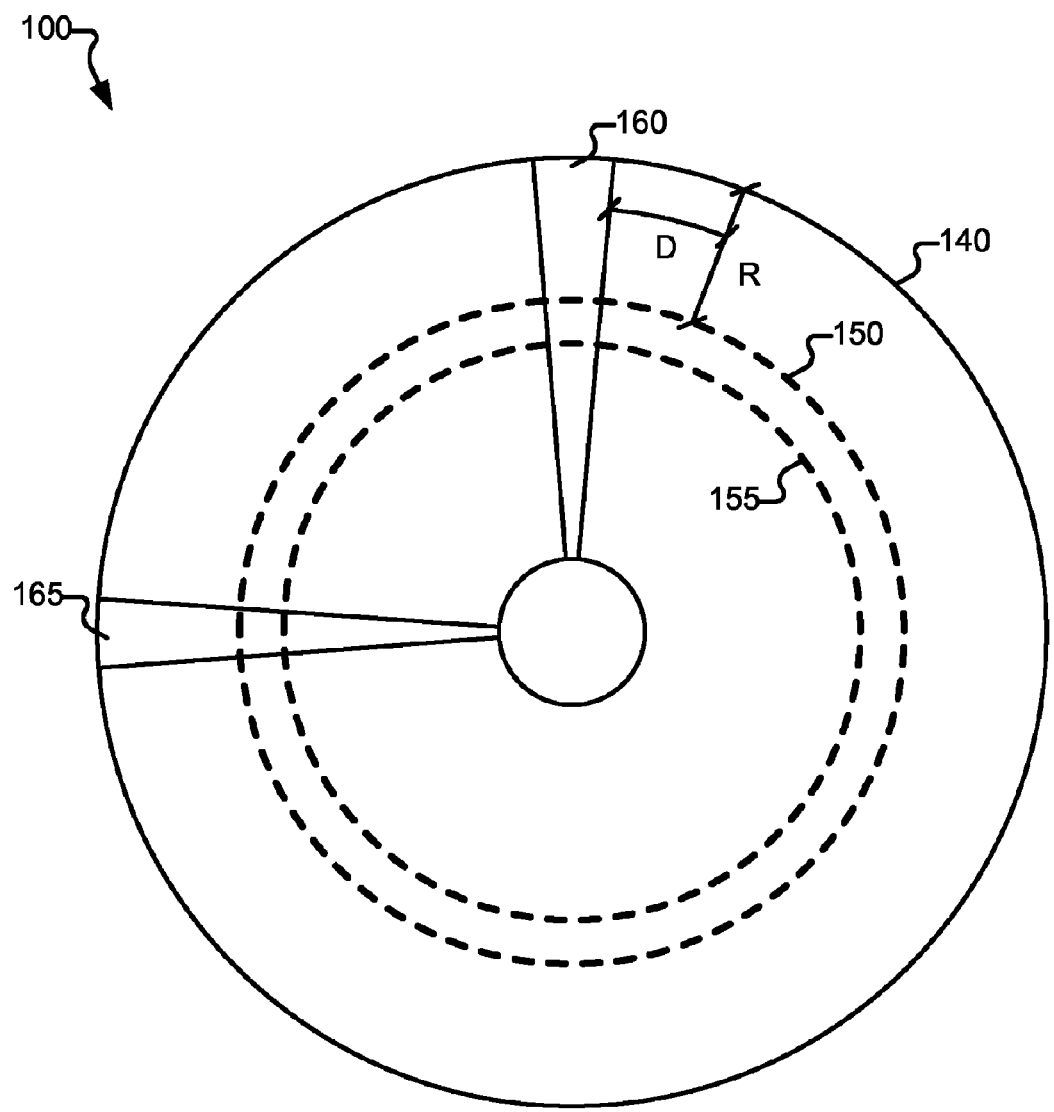
FIG. 1 depicts a known storage medium layout.
Figure 1:
Figure 2:
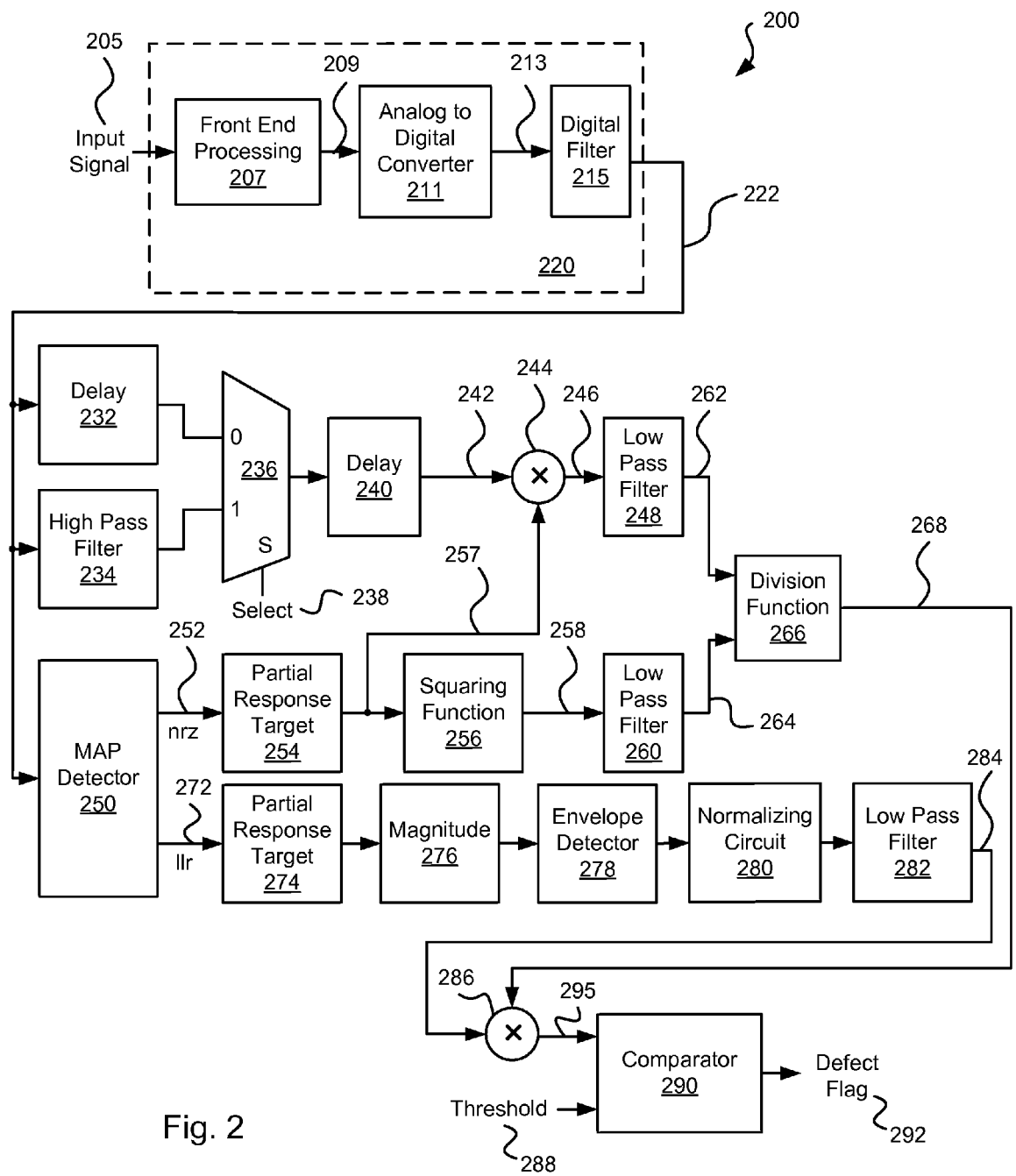
FIG. 2 is a block diagram of a media defect detector in accordance with one or more embodiments of the present invention.

Turning to FIG. 2, a block diagram depicts a media defect detector 200 in accordance with one or more embodiments of the present invention. Media defect detector 200 receives a series of data samples 222. Data samples 222 are derived from a storage medium (not shown) via an input signal 205 provided to an input circuit 220. Input circuit 220 receives input signal 205 that is an analog signal representing data sensed from the storage medium. A front end processing circuit 207 applies, among other things, amplification and/or analog filtering to input signal 205 and provides an analog signal 209 to an analog to digital converter 211. Analog to digital converter 211 samples analog signal 209 at a sampling rate and provides a series of digital samples 213. Digital samples 213 are filtered using a digital filter 215 that provides data samples 222. In some cases, digital filter 215 is a ten tap digital finite impulse response filter as is known in the art.

MAP data detector 250 performs a maximum a posteriori data detection on data samples 222 as is known in the art. MAP data detector 250 provides both a hard output (nrz) 252 and a soft output (llr) 272. Hard output 252 is a series of determined values for each bit period of the input bit stream, and the corresponding soft output 272 indicates a likelihood that the respective hard output 252 is correctly determined. In some embodiments of the present invention, hard output 252 is either a logic '1' or a logic '0', and soft output 272 is a log-likelihood ratio representing the probability that the corresponding hard output 252 is accurate. In one case, soft output 272 is a value between negative thirty-two and positive thirty-two with the lowest value corresponding to the lowest probability and the highest value corresponding to the highest probability.

Hard output 252 is provided to a partial response target filter 254. In some cases, partial response target filter 254 is a two tap digital finite impulse response filter as is known in the art. Based upon the disclosure provided herein, one of ordinary skill in the art will recognize other partial response target filters that may be used in relation to different embodiments of the present invention. A partial response output 257 is provided to a squaring function 256 to create a squared output 258 (i.e., $f(x)=x^2$). Squared output 258 is provided to a low pass filter 260 that in turn provides a low pass filtered signal 264. Low pass filter 260 may be any low pass filter known in the art. In one particular embodiment, low pass filter 260 is a thirty-two bit MA filter as are known in the art. In addition, partial response output 257 is provided to a multiplier circuit 244.

Soft output 272 is provided to a partial response target filter 274. In some cases, partial response target filter 274 is a two tap digital finite impulse response filter as is known in the art. Based upon the disclosure provided herein, one of ordinary skill in the art will recognize other partial response target filters that may be used in relation to different embodiments of the present invention. The output of partial response target filter 274 is provided to a magnitude function 276 that returns the absolute value of the output from partial response target filter 274. The magnitude output is provided to an envelope detector 278. Envelope detector 278 may be any envelope detector known in the art. In one case, envelope detector 278 may be implemented similar to that disclosed in U.S. patent application Ser. No. 12/236,148 entitled "Systems and Methods for Low Latency Media Defect Detection", and filed Sep. 23, 2008 by Cao et al. The entirety of the aforementioned reference is incorporated herein by reference for all purposes. In one particular embodiment of the present invention, envelope detector 278 operates in accordance with the following pseudocode:

```
If (magnitude_i > magnitude_{i-1}){
    output = magnitude_i
}
Else{
    output = magnitude_i - envelope decay
},
``` where $magnitude_i$ is the current output from magnitude function 276, $magnitude_{i-1}$ is the preceding output from magnitude function 276, and envelope decay is a programmable decay value used by envelope detector 278. The resulting output of envelope detector 278 is provided to a normalizing circuit 280. Normalizing circuit 280 operates to normalize the value from envelope detector 278 to one. The output of normalizing circuit 280 provides a probability where one is equivalent to a high probability and other values down to zero correspond to respectively lower probabilities. The output of normalizing circuit 280 is provided to a low pass filter 282 that in turn provides a low pass filtered signal 284.

Data samples 222 are provided in parallel to a delay circuit 232 and a high pass filter 234. In some embodiments of the present invention, high pass filter 234 is a thirty-two bit MA filter as are known in the art. Based upon the disclosure provided herein, one of ordinary skill in the art will recognize a variety of high pass filters that may be used in relation to different embodiments of the present invention. Delay circuit 232 delays the received signal by a time period corresponding to the time required to pass through high pass filter 234. A multiplexer 236 selects either the output of high pass filter 234 or the output of delay circuit 232 based upon a select input 238. The selected output from multiplexer 236 is provided to a delay circuit 240. Delay circuit 240 provides a delayed output 242 that is delayed in time by an amount corresponding to the time used by MAP detector circuit 250 and partial response target filter 254. Said another way, delay circuit 240 operates to align delayed output 242 with partial response output 257 (i.e., to assure that each output is derived from the same data samples 222). Multiplier circuit 244 multiplies delayed output 242 by partial response output 257 to yield a multiplication product output 246. Product output 246 is provided to a low pass filter 248 that in turn provides a low pass filtered signal 262. Low pass filtered signal 262 is divided by low pass filtered signal 264 by a division function 266. Division function 266 provides a division product 268.

Division product 268 is multiplied by a low pass filtered signal 284 using a multiplier circuit 286. A multiplication product 295 from multiplier circuit 286 is compared with a threshold 288 using a comparator 290. Where multiplication product 295 is less than threshold 288, a defect flag 292 is asserted. Otherwise, defect flag 292 remains de-asserted.

In operation, input signal 205 is received from, for example, a read/write head assembly (not shown) that is disposed in relation to a storage medium (also not shown). Input signal is filtered and/or amplified by front end processing circuit 207, and the resulting output is converted to digital samples 213 by an analog to digital converter 211. Data samples 222 are generated by digitally filtering digital samples 213. Data samples 222 may be high pass filtered to remove any DC offset depending upon the assertion level of select input 238. In some cases, a defective region of a storage medium produces data samples 222 that exhibit a substantial DC offset that can be removed by high pass filter 234. In other cases, a defective region of a storage medium produces data samples 222 that are attenuated, but symmetric around a DC offset that is common to signals from non-defective regions. Multiplexer 236 allows for selection between unmodified data samples 222 or a high pass filtered version of data samples 222 depending upon a user's preference. In some cases, the output of multiplexer 236 will exhibit a relatively large amplitude for signals derived from a non-defective region of the storage medium, and a relatively small amplitude for signals derived from a defective region of the storage medium.

MAP data detector 250 performs a maximum a posteriori data detection on data samples 222 that produces hard output 252 and soft output 272. Hard outputs 252 are PR filtered by partial response target filter 254, with the results being squared by squaring function 256. The squared result exhibits a strong correlation to product output 246 where the original signal is derived from a non-defective region. In addition, output 262 exhibits a strong correlation to output 264 where the original signal is derived from a non-defective region. The correlation is substantially less when the samples come from a defective region, but the amplitude of both product output 246 output and the squared result is decreased where the samples come from defective regions. Because of the correlation, division product 268 should be approximately one for non-defective regions, but is substantially less than one for defective regions. As such, division product 268 can be used as an indicator of a media defect on the storage medium.

Division product 268 is further refined by multiplying it with processed soft input 272. In particular, soft input 272 is normalized to one with a value of one representing the highest probability and zero representing the lowest. For data derived from non-defective regions, soft input 272 is generally high due to a high signal to noise ratio. In contrast, for data derived from defective regions, soft input 272 is generally low due to a low signal to noise ratio. By multiplying division product 268 by the processed soft data 272, the contrast between data derived from a defective region and from a non-defective region is enhanced. This allows, among other things, for the detection of defective regions that exhibit only small reductions in signal amplitude compared with non-defective regions.

It should be noted that a number of variations of media defect detector 200 are possible in accordance with different embodiments of the present invention. For example, in some embodiments, partial response target filter 274 may be eliminated. Based upon the disclosure provided herein, one of ordinary skill in the art will recognize other modifications that may be made.

Figure 3:
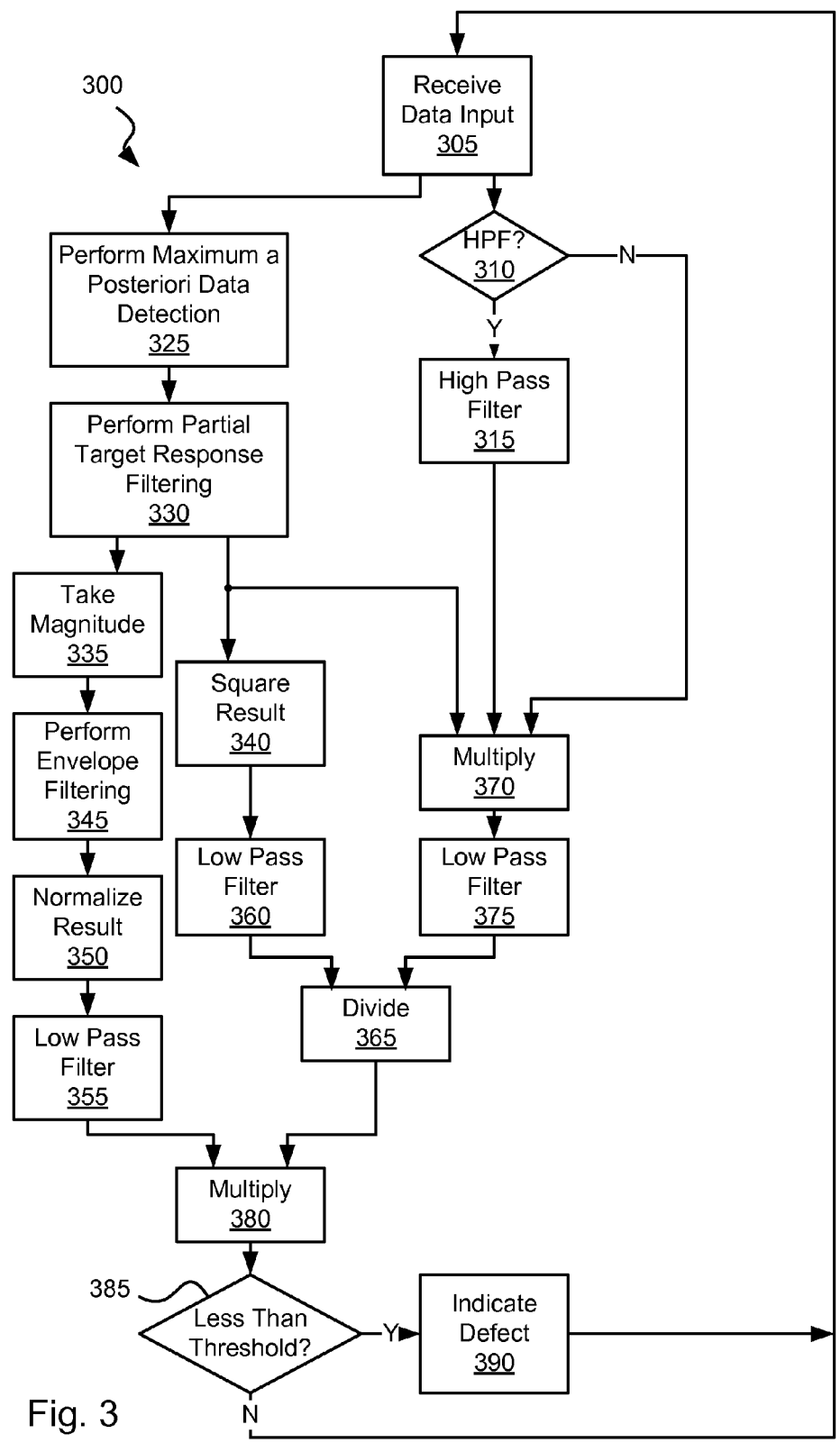
FIG. 3 is a flow diagram showing a method for media defect detection in accordance with some embodiments of the present invention.

Turning to FIG. 3, a flow diagram 300 shows a method for media defect detection in accordance with some embodiments of the present invention. Following flow diagram 300, a data input is received (block 305). The data input is a series of digital samples corresponding to information stored on a magnetic storage medium. It is determined whether high pass filtering is desired (block 310). Such high pass filtering is desirable where the received data input exhibits a DC offset. Where high pass filtering is selected (block 310), the received data samples are passed through a high pass filter (block 315).

In parallel, a maximum a posteriori data detection is performed on the received data input resulting in both soft decisions and hard decisions (block 325). Partial target response filtering is applied to both the hard decisions and the soft decisions (block 335). The hard decisions are then squared (block 340). The squared hard decisions are low pass filtered (block 360). In addition, the partial response filtered hard decisions are multiplied by the high pass filtered received data input (block 315) or the raw data input (block 305) depending upon the determination of block 310 (block 370). The product of the multiplication (block 370) exhibits an attenuated signal amplitude where the data from which it was derived came from a defective region on the storage medium. The product of the multiplication (block 370) is low pass filtered (block 375), and the result is divided by the result of the low pass filtering of block 360 (block 365). Where the data input was received from a non-defective region of the storage medium, there is a strong correlation between the hard decisions resulting from the data detection process and the data input. As such, the result of the division process (block 365) is approximately one. In contrast, where the data input is derived from a defective region, the correlation is not as strong and the result of the division process (block 365) is substantially less than one.

An absolute value or magnitude of the filtered soft decisions from the partial response filtering block 330 is taken (block 335), and envelope filtering is applied to the resulting magnitude values (block 345). The result of the envelope filtering is then normalized to one (block 350) and the normalized values are low pass filtered (block 355). The resulting filtered values (block 355) are multiplied by the result of the division process of block 365 (block 380). The resulting filtered values (block 355) will be low when the data input was received from a defective region, and will be high when the data input was received from a non-defective region. As such, multiplying the result of the division process (block 365) by the resulting filtered values (block 355) enhances the difference between defective and non-defective regions. This makes it easier to detect a defective region of a storage medium even where the amplitude of the received data input is attenuated only a small amount when compared to signals received from a non-defective region. The result of the multiplication process (block 380) is compared with a threshold value (block 385). Where the result is less than the threshold value (block 385), a defect is indicated (block 390). Otherwise, a defect is not indicated.

Figure 4:
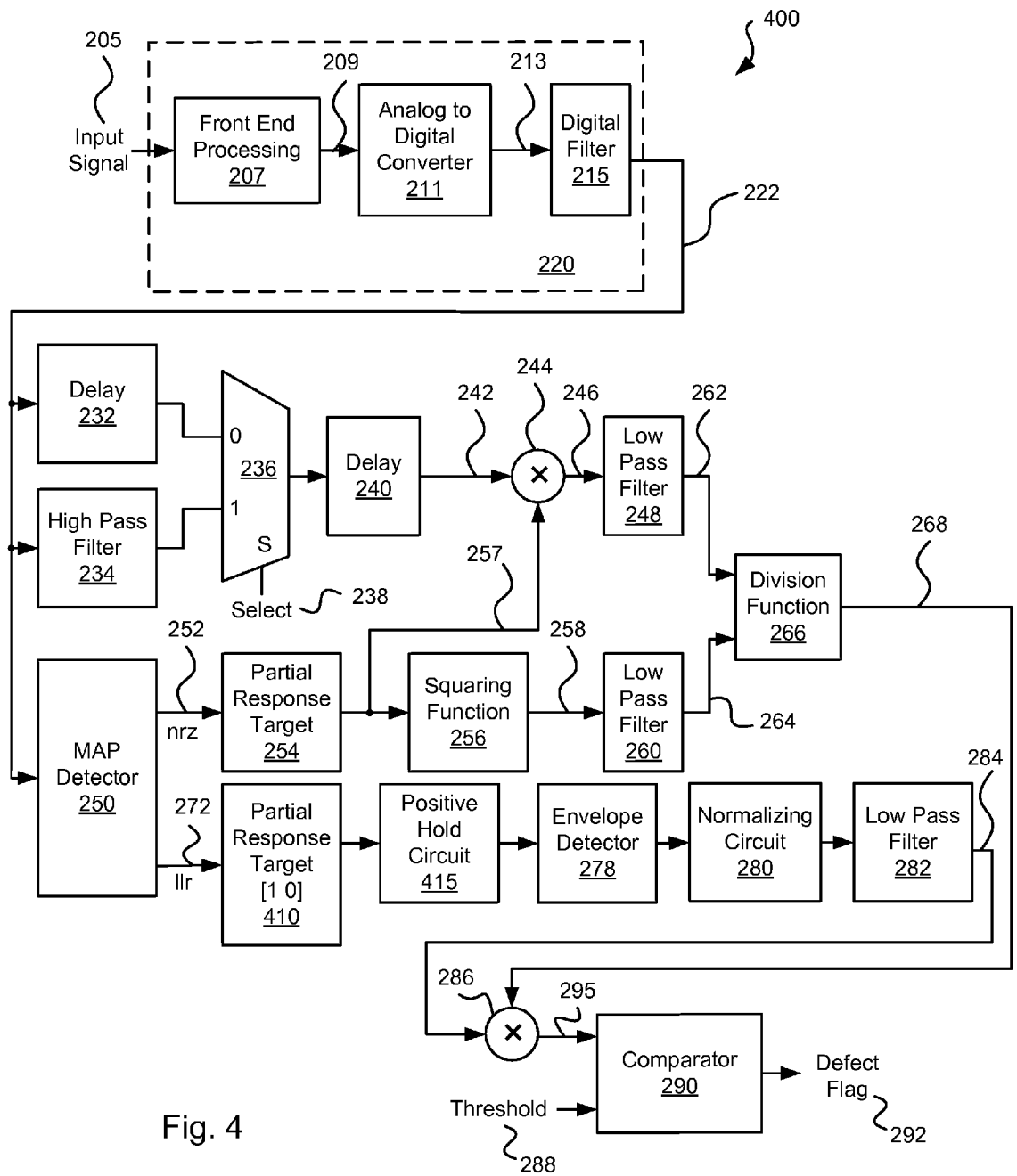
FIG. 4 is a block diagram of another media defect detector in accordance with other embodiments of the present invention.

Turning to FIG. 4, a block diagram depicts a media defect detector 400 in accordance with some embodiments of the present invention. Media defect detector 400 is similar to media defect detector 200, except that it is designed to operate where there is substantial asymmetry in the path processing soft output 272. For example, where a pre-coder is employed, the output of a two tap partial response target filter with taps of '1' and '0' may generate an output that exhibits negative magnitudes that are substantially larger than corresponding positive magnitudes. In such a case, a positive hold circuit 415 may be used to yield a magnitude value. Positive hold circuit 415 operates in accordance with the following pseudo-code:

```
If (input_i >= 0){
    Output = input_i }
Else {
    Output = input_{i-1} },
``` where $input_i$ is the current output from partial response target filter 410, $input_{i-1}$ is the preceding output from partial response target filter 410, and output is the output provided by positive hold circuit 415. The output of partial response filter 410 conforms to a [1, 0] target, and thus operates as if there is no partial response filter employed. Accordingly, some embodiments of the present invention may omit partial response filter 410. Use of positive hold circuit 415 provides a series of positive magnitude values, but is not affected by the large negative swings exhibited in some circuit configurations. Similar to media defect detector 200, media defect detector 400 provides for, among other things, detecting defective regions that exhibit only small reductions in signal amplitude compared with non-defective regions.

Figure 5:
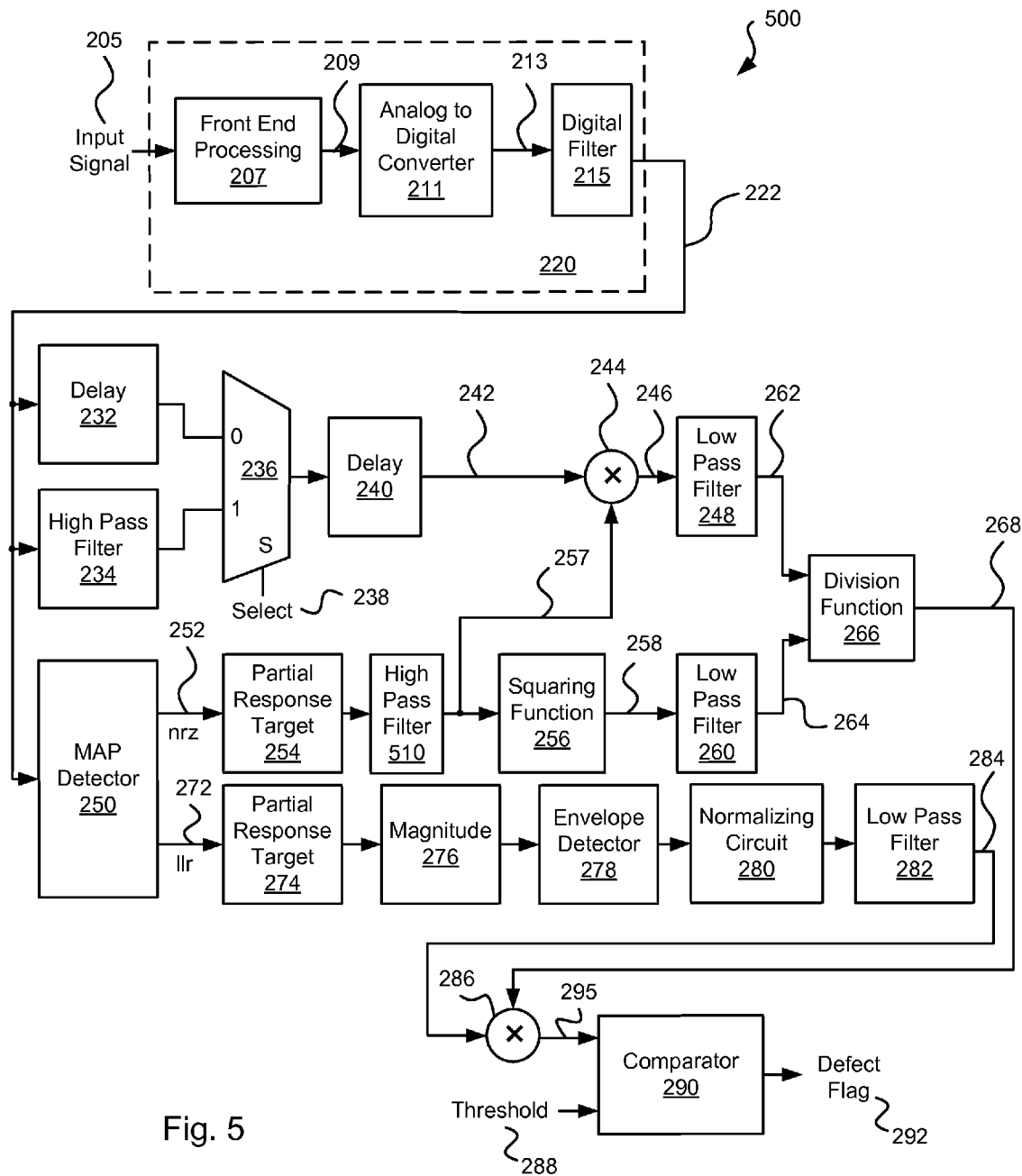
FIG. 5 is a block diagram of another media defect detector in accordance with other embodiments of the present invention.

Turning to FIG. 5, a block diagram depicts a media defect detector 500 in accordance with various embodiments of the present invention. Media defect detector 500 is similar to media defect detector 200, except that it is designed to address any distortion resulting from high pass filter 234. In particular, a high pass filter 510 is added to the path responsible for processing hard outputs 252. High pass filter 510 is the same as high pass filter 234. Thus, the same distortion introduced by high pass filter 234 is introduced by high pass filter 510. As the result from the data path including high pass filter 234 is divided by the result from the data path including high pass filter 510, any introduced distortion is cancelled. Similar to media defect detector 200, media defect detector 500 provides for, among other things, detecting defective regions that exhibit only small reductions in signal amplitude compared with non-defective regions.

Figure 6:
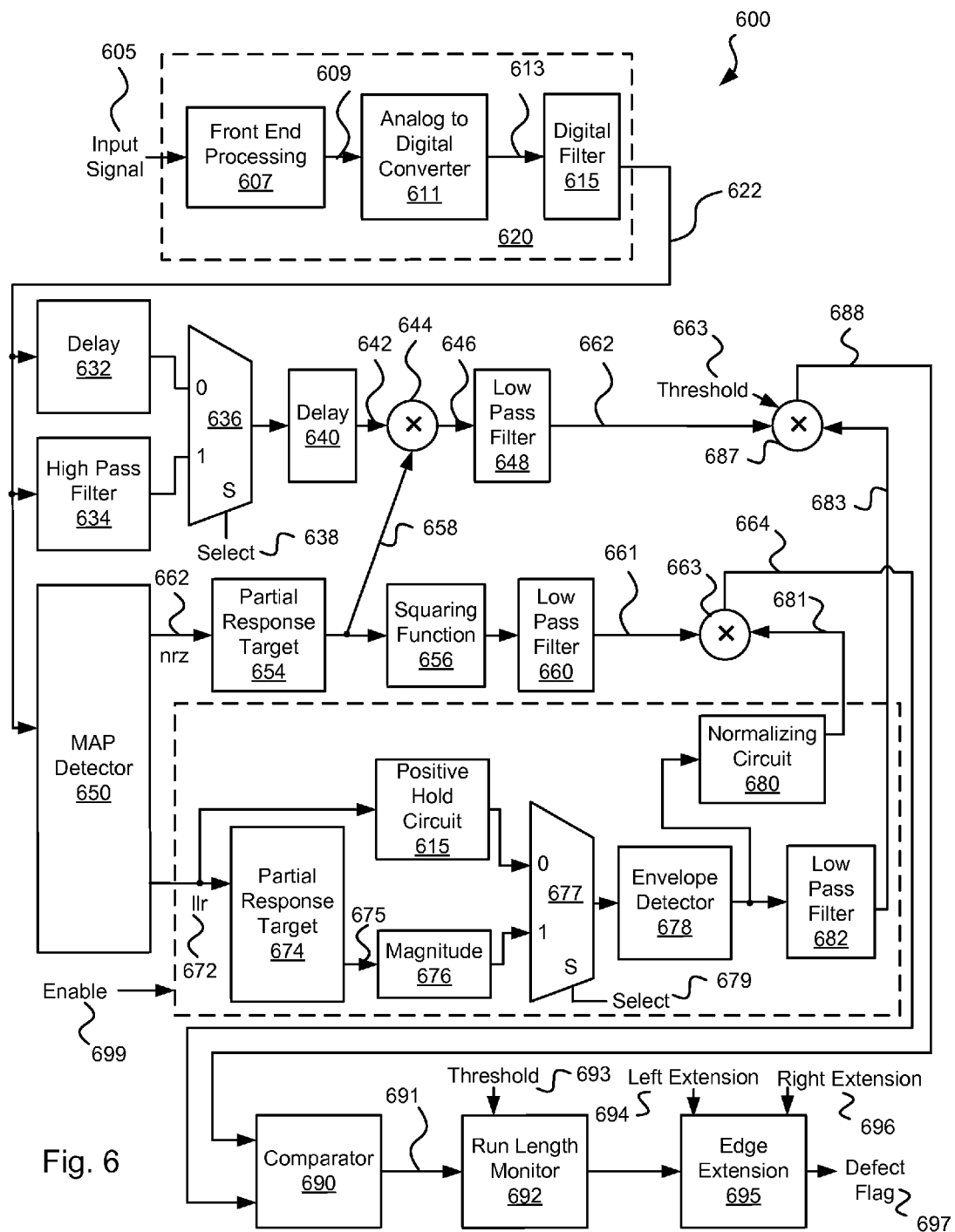
FIG. 6 shows one particular implementation of a media defect detector in accordance with some embodiments of the present invention.

Turning to FIG. 6, a particular implementation of a media defect detector 600 is shown in accordance with some embodiments of the present invention. Media defect detector 600 provides an ability to select between the functionality of media defect detector 200 and the functionality of media defect detector 400 depending upon any asymmetry in the input signal. Media defect detector 600 includes an input circuit 620 that is responsible for receiving and sampling a data input 605. Data input 605 is provided by a read/write head assembly (not shown) disposed in relation to a storage medium (not shown). Input circuit 620 includes a front end processing circuit 607 that applies, among other things, amplification and/or analog filtering to input signal 605 and provides an analog signal 609 to an analog to digital converter 611. Analog to digital converter 611 samples analog signal 609 at a sampling rate and provides a series of digital samples 613. Analog to digital converter 611 may be any circuit known in the art that is capable of converting an analog signal to a series of digital samples. Digital samples 613 are filtered using a digital filter 615 that provides data samples 622. In some cases, digital filter 615 is a ten tap digital finite impulse response filter as is known in the art. Based upon the disclosure provided herein, one of ordinary skill in the art will recognize a variety digital filters that may be used in relation to different embodiments of the present invention.

Data samples 622 are provided in parallel to a delay circuit 632, a high pass filter 634, and a MAP data detector 650. MAP data detector 650 performs a maximum a posteriori data detection on data samples 622 as is known in the art. This data detection process produces both a hard output (nrz) 652 and a soft output (llr) 672. Hard output 652 is a series of determined values for each bit period of the input bit stream, and the corresponding soft output 672 indicates a likelihood that the respective hard output 652 is correctly determined. In some embodiments of the present invention, hard output 652 is either a 'positive 1' or a 'negative 1', and soft output 672 is a log-likelihood ratio representing the probability that the corresponding hard output 652 is accurate. In one case, soft output 672 is a value between negative thirty-two and positive thirty-two with the lowest value corresponding to the lowest probability and the highest value corresponding to the highest probability.

Hard output 652 is provided to a partial response target filter 654. Partial response target filter 654 provides a partial response output 658 to a squaring function 656. In some cases, partial response target filter 654 is a two tap digital finite impulse response filter as is known in the art. Partial response output 658 is provided to a squaring function 656 to create a squared output (i.e., $f(x)=x^2$). The squared output is provided to a low pass filter 660 that filters the received input and provides a filtered output 661. Low pass filter 660 may be any low pass filter known in the art. In one particular embodiment, low pass filter 660 is a thirty-two bit MA filter as are known in the art. In addition, partial response output 658 is provided to a multiplier circuit 644.

Soft output 672 is provided to a partial response target filter 674 and to a positive hold circuit 615. Positive hold circuit 615 may be used to yield a magnitude value in accordance with the following pseudocode:

```
If (input_i >= 0){
    Output = input_i }
Else {
    Output = input_{i-1} },
``` where $input_i$ is the current soft output 672, $input_{i-1}$ is the preceding soft output 672, and output is the output provided by positive hold circuit 615. The output of positive hold circuit 615 is provided to a multiplexer 677. In some cases, partial response target filter 674 is a two tap digital finite impulse response filter as is known in the art. Based upon the disclosure provided herein, one of ordinary skill in the art will recognize other partial response target filters that may be used in relation to different embodiments of the present invention. A partial response output 675 from partial response target filter 674 is provided to a magnitude function 676. Magnitude function 676 returns the absolute value of partial response output 675, and the magnitude is provided to multiplexer 677. Depending upon the assertion level of a select input 679, multiplexer 677 provides either the magnitude output from magnitude function 676 or the output of positive hold circuit 615 to an envelope detector 678. Envelope detector 678 may be any envelope detector known in the art. In one particular embodiment of the present invention, envelope detector 678 operates in accordance with the following pseudocode:

```
If (input_i > input_{i-1}){
    output = input_i
}
Else{
    output = input_i − envelope decay
},
``` where $input_i$ is the current output from multiplexer 677, $input_{i-1}$ is the preceding output from multiplexer 677, and envelope decay is a programmable decay value used by envelope detector 678. The resulting output of envelope detector 678 is provided to a low pass filter 682 that provides a filtered output 683.

The output of envelope detector 678 is provided to a normalizing circuit 680. Normalizing circuit 680 operates to normalize the output of envelope detector 678 to one. A normalized output 681 from normalizing circuit 680 provides a probability where one is equivalent to a high probability and other values down to zero correspond to respectively lower probabilities. Normalized output 681 is provided along with filtered output 661 to a multiplier 663. A multiplication product 664 from multiplier 663 is filtered output 661 attenuated by the probability value represented by normalized output 681.

Data samples 622 are provided in parallel to a delay circuit 632 and a high pass filter 634. In some embodiments of the present invention, high pass filter 634 is a thirty-two bit MA filter as are known in the art. Based upon the disclosure provided herein, one of ordinary skill in the art will recognize a variety of high pass filters that may be used in relation to different embodiments of the present invention. Delay circuit 632 delays the received signal by a time period corresponding to the time required to pass through high pass filter 634. A multiplexer 636 selects either the output of high pass filter 634 or the output of delay circuit 632 based upon a select input 638. The selected output from multiplexer 636 is provided to a delay circuit 640. Delay circuit 640 provides a delayed output 642 that is delayed in time by an amount corresponding to the time used by MAP detector circuit 650 and a partial response target filter 654. Said another way, delay circuit 640 operates to align delayed output 642 with partial response output 658 (i.e., to assure that each output is derived from the same data samples 622). Multiplier circuit 644 multiplies delayed output 642 by partial response output 658 to yield a multiplication product output 646. Product output 646 is provided to a low pass filter 648 that in turn provides a low pass filtered signal 662.

Low pass filtered signal 662, filtered output 683 and a threshold value 663 are multiplied by a multiplier circuit 687 to provide a multiplication product 688 in accordance with the following equation:

Multiplication Product 688=(Threshold 663)*(Low Pass Filtered Signal 662)*(Filtered Output 683).

Multiplication product 688 is compared with a multiplication product 664 using a comparator 690. Where multiplication product 688 is less than multiplication product 664, a defect signal 691 is asserted to indicate a media defect is found. Otherwise, no media defect is found.

Defect signal 691 is provided to a run length monitor circuit 692 that requires assertion of defect signal 691 for a programmable threshold number 693 of cycles before a defect is indicated. Once a defect is indicated by run length monitor 692, an edge extension circuit 695 marks the beginning and end of a corresponding defective region using a programmable right extension value 694 and a programmable left extension value 696. Run length monitor 692 and edge extender circuit 695 may be implemented similar to that disclosed in U.S. patent application Ser. No. 12/111,255 entitled "Systems and Methods for Media Defect Detection Utilizing Correlated DFIR and LLR Data", and filed Apr. 29, 2008 by Tan et al. The entirety of the aforementioned reference is incorporated herein by reference for all purposes.

Figure 7:
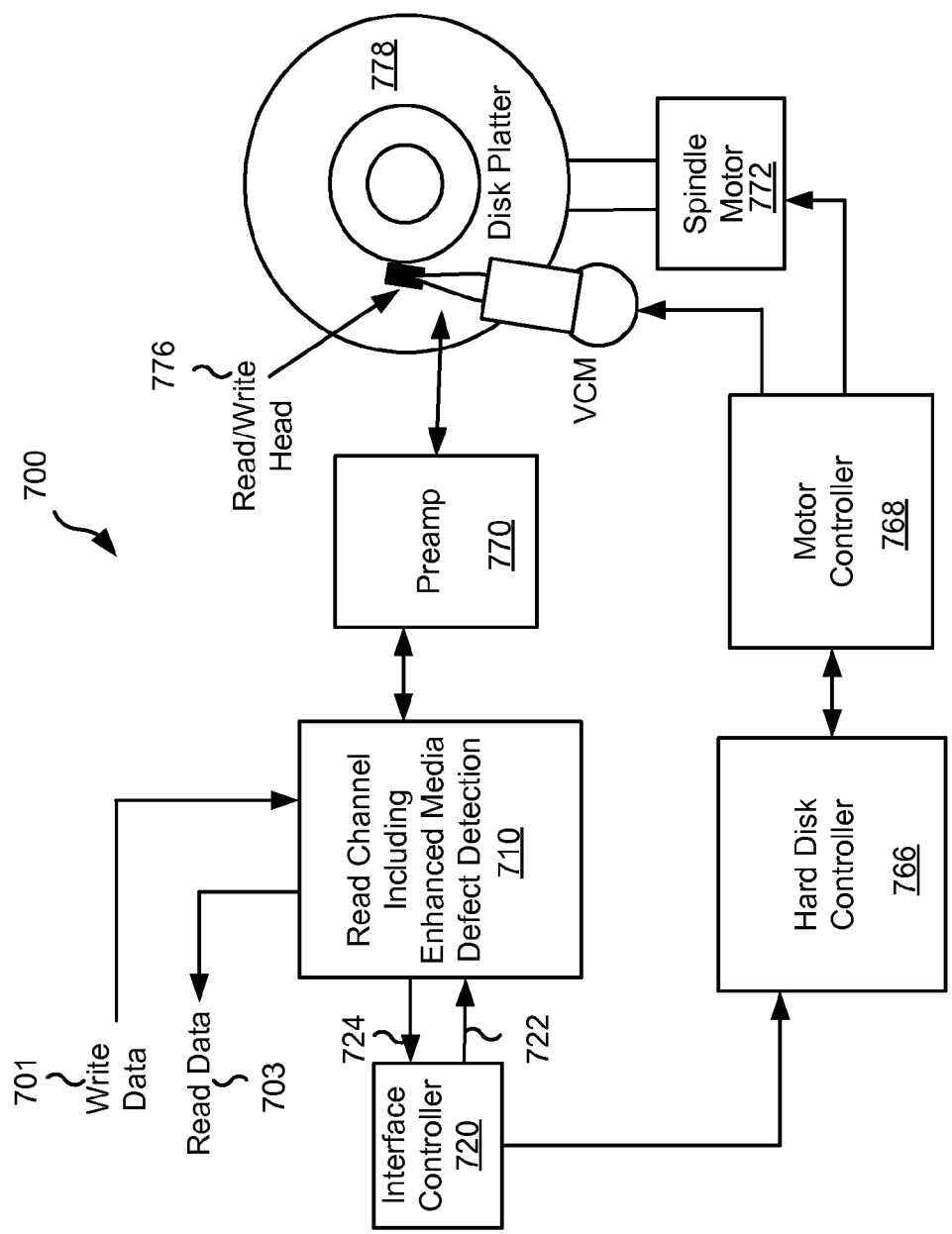
FIG. 7 depicts a storage system including a media defect detector circuit in accordance with various embodiments of the present invention.

Turning to FIG. 7, a storage system 700 including a read channel 710 with an enhanced media defect detection circuit is shown in accordance with various embodiments of the present invention. Storage system 700 may be, for example, a hard disk drive. Storage system 700 also includes a preamplifier 770, an interface controller 720, a hard disk controller 766, a motor controller 768, a spindle motor 772, a disk platter 778, and a read/write head 776. Interface controller 720 controls addressing and timing of data to/from disk platter 778. The data on disk platter 778 consists of groups of magnetic signals that may be detected by read/write head assembly 776 when the assembly is properly positioned over disk platter 778. In one embodiment, disk platter 778 includes magnetic signals recorded in accordance with a perpendicular recording scheme. Addressing source 790 supplies addresses to interface control 720 directing locations on disk platter 778 to which and from which data is to be respectively read and written. Defect information may be provided to a mapping control module (not shown) that is operable to receive indications of one or more regions of disk platter 778 that are defective, and to map the regions such that they are not used as is known in the art.

In a typical read operation, read/write head assembly 776 is accurately positioned by motor controller 768 over a desired data track on disk platter 778. Motor controller 768 both positions read/write head assembly 776 in relation to disk platter 778 and drives spindle motor 772 by moving read/write head assembly to the proper data track on disk platter 778 under the direction of hard disk controller 766. Spindle motor 772 spins disk platter 778 at a determined spin rate (RPMs). Once read/write head assembly 778 is positioned adjacent the proper data track, magnetic signals representing data on disk platter 778 are sensed by read/write head assembly 776 as disk platter 778 is rotated by spindle motor 772. The sensed magnetic signals are provided as a continuous, minute analog signal representative of the magnetic data on disk platter 778. This minute analog signal is transferred from read/write head assembly 776 to read channel module 710 via preamplifier 770. Preamplifier 770 is operable to amplify the minute analog signals accessed from disk platter 778. In turn, read channel module 710 decodes and digitizes the received analog signal to recreate the information originally written to disk platter 778. This data is provided as read data 503 to a receiving circuit. A write operation is substantially the opposite of the preceding read operation with write data 701 being provided to read channel module 710. This data is then encoded and written to disk platter 778.

The enhanced media defect detection circuit may be similar to those discussed above in relation to FIG. 2, FIG. 4, FIG. 5 or FIG. 6, and/or may operate similar to that discussed above in relation to FIG. 3. Such enhanced media defect detection circuits are capable of identifying media defects on disk platter 778.

In conclusion, the invention provides novel systems, devices, methods and arrangements for identifying defective regions on storage mediums. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A media defect detection system, the system comprising:
a data input;
a data detector circuit, wherein the data detector circuit applies a detection algorithm to the data input and provides a hard output and a soft output;
a first circuit combining a first derivative of the hard output with a derivative of the data input to yield a first combined signal;
a second circuit combining a second derivative of the hard output with a derivative of the first combined signal to yield a second combined signal; and
a third circuit combining a derivative of the soft output with the second combined signal and a threshold value to yield a defect signal.

2. The media defect detection system of claim 1, wherein the detection algorithm is a maximum a posteriori algorithm.

3. The media defect detection system of claim 1, wherein the first circuit includes a multiplier circuit, and wherein the first combined output is the first derivative of the hard output multiplied by the derivative of the data input.

4. The media defect detection system of claim 3, wherein the system further comprises:
a partial response target filter circuit; and
wherein the first derivative of the hard output is the hard output after processing by the partial response target filter circuit.

5. The media defect detection system of claim 3, wherein the system further comprises:
a partial response target filter circuit receiving the hard output and providing the first derivative of the hard output.

6. The media defect detection system of claim 1, wherein the second circuit includes a division circuit, and wherein the second combined output is a ratio of the second derivative of the hard output and the derivative of the first combined signal.

7. The media defect system of claim 6, wherein the system further comprises:
a partial response target filter circuit;
a squaring circuit;
a low pass filter; and
wherein the second derivative of the hard output is the hard output after processing by the partial response target filter circuit, the squaring circuit and the low pass filter.

8. The media defect system of claim 1, wherein the system further comprises:
a partial response target filter circuit receiving the soft output;
a polarity adjustment circuit, wherein the polarity adjustment circuit receives an output from the partial response target filter circuit and eliminates negative polarity signals to yield a polarity output;
an envelope detector, wherein the envelope detector performs a filtering of the polarity output to yield an envelope output;
a normalizing circuit, wherein the normalizing circuit normalizes the envelope output to one to yield a normalized output; and
a low pass filter that low pass filters the normalized output to yield the derivative of the soft output.

9. The media defect system of claim 8, wherein the polarity adjustment circuit is selected from a group consisting of: a magnitude circuit and a positive hold circuit.

10. The media defect system of claim 1, wherein the threshold value is programmable.

11. A media defect detection circuit, the circuit comprising:
a data input;

a data detector circuit, wherein the data detector circuit applies a detection algorithm to the data input and provides a hard output and a soft output;

a first circuit combining a first derivative of the hard output with a derivative of the data input to yield a first combined signal;

a second circuit combining a second derivative of the hard output with a first derivative of the soft output to yield a second combined signal;

a third circuit combining a second derivative of the soft output with a derivative of the first combined signal and a threshold value to yield a third combined signal; and a comparator, wherein the comparator compares the third combined signal with the second combined signal to yield a defect signal.

12. The media defect detection circuit of claim 11, wherein the detection algorithm is a maximum a posteriori algorithm.

13. The media defect detection circuit of claim 11, wherein the threshold value is programmable.

14. The media defect detection circuit of claim 11, wherein the circuit further includes a partial response target filter receiving the hard output and providing the first derivative of the hard output, wherein the first circuit includes a multiplier circuit, wherein the first combined output is the first derivative of the hard output multiplied by the derivative of the data input.

15. The media defect detection circuit of claim 14, wherein the circuit further includes a normalizing circuit, wherein the normalizing circuit receives the soft output and provides the first derivative of the soft output; wherein the second circuit includes a multiplier circuit; and wherein the second combined output is the first derivative of the soft output multiplied by the second derivative of the hard output.

16. The media defect detection circuit of claim 15, wherein the third circuit includes a multiplier, and wherein the third combined signal is the product of multiplying the first combined signal, the threshold value, and the second derivative of the soft output.

17. The media defect detection circuit of claim 16, wherein the partial response filter is a first partial response filter; wherein the circuit further includes:

a second partial response target filter receiving the soft output and providing a partial response output;

a polarity adjustment circuit, wherein the polarity adjustment circuit receives the partial response output and eliminates negative polarity signals to yield a polarity output;

an envelope detector circuit, wherein the envelope detector circuit yields an envelope filtered output;

a low pass filter wherein the low pass filter receives the envelope filtered output and provides the second derivative of the soft output.

18. The media defect circuit of claim 17, wherein the polarity adjustment circuit is selected from a group consisting of: a magnitude circuit and a positive hold circuit.

19. A method for media defect detection, the method comprising:

receiving a data input;

performing a data detection on the data input, wherein the data detection yields a hard output and a soft output;

multiplying a first derivative of the hard output by a derivative of the data input to yield a first combined signal;

multiplying a second derivative of the hard output by a first derivative of the soft output to yield a second combined signal;

multiplying a second derivative of the soft output by a derivative of the first combined signal and a threshold value to yield a third combined signal; and comparing the third combined signal with the second combined signal to yield a defect flag.

20. The method of claim 19, wherein the data detection is a maximum a posteriori detection process.

* * * * *